(12) United States Patent
Huang et al.

(10) Patent No.: US 11,876,526 B2
(45) Date of Patent: Jan. 16, 2024

(54) ANALOG TO DIGITAL CONVERSION APPARATUS AND METHOD HAVING QUICK CONVERSION MECHANISM

(71) Applicant: REALTEK SEMICONDUCTOR CORPORATION, Hsinchu (TW)

(72) Inventors: Shih-Hsiung Huang, Hsinchu (TW); Kai-Yue Lin, Hsinchu (TW); Wei-Jyun Wang, Hsinchu (TW); Sheng-Yen Shih, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 49 days.

(21) Appl. No.: 17/670,536

(22) Filed: Feb. 14, 2022

(65) Prior Publication Data

US 2022/0337259 A1 Oct. 20, 2022

(30) Foreign Application Priority Data

Apr. 15, 2021 (TW) ................. 110113649

(51) Int. Cl.
*H03M 1/06* (2006.01)
*H03M 1/08* (2006.01)

(52) U.S. Cl.
CPC .................... *H03M 1/08* (2013.01)

(58) Field of Classification Search
CPC ........ H03M 1/1215; H03M 1/12; H03M 1/38; H03M 1/1245; H03M 1/466; H03M 1/1225; H03M 1/0607; H03M 1/468; H03M 1/00; H03M 1/462; H03M 1/0614; H03M 1/0854; H03M 1/10; H03M 1/403; H03M 1/0863

USPC ........... 341/118–12, 155, 161, 172, 118–120
See application file for complete search history.

(56) References Cited

U.S. PATENT DOCUMENTS

| | | | | |
|---|---|---|---|---|
| 9,793,910 | B1* | 10/2017 | Devarajan | H03M 1/124 |
| 10,333,543 | B1* | 6/2019 | Hurrell | H03M 1/462 |
| 10,778,242 | B2* | 9/2020 | Huang | H03M 1/468 |
| 11,121,720 | B2* | 9/2021 | Weng | H03M 1/121 |
| 11,171,662 | B1* | 11/2021 | Steensgaard-Madsen | H03M 1/069 |
| 2018/0183450 | A1* | 6/2018 | Liu | H03M 1/1215 |
| 2020/0228129 | A1* | 7/2020 | Huang | H03M 1/0854 |

(Continued)

OTHER PUBLICATIONS

Nicholas Wood et al., Predicting ADC: A New Approach for Low Power ADC Design, 2014, IEEE.

*Primary Examiner* — Linh V Nguyen
(74) *Attorney, Agent, or Firm* — WPAT, P.C.

(57) ABSTRACT

The present invention discloses an analog to digital conversion (ADC) apparatus having quick conversion mechanism. Each of ADC circuits receives a previous higher-bit conversion result to perform prediction to generate a current higher-bit conversion result, performs conversion on an input analog signal according to a sampling clock that has a frequency at least twice of the frequency of the input analog signal based on a successive-approximation mechanism to generate a current lower-bit conversion result, and combines the current higher-bits and current lower-bit conversion results to generate a current conversion result and output a remained signal amount as a residue. A noise-shaping circuit performs calculation based on the residue to generate a noise-shaping reference signal. Each of the ADC circuits combines the current conversion result and the noise-shaping reference signal to generate an output digital signal.

12 Claims, 4 Drawing Sheets

(56) References Cited

U.S. PATENT DOCUMENTS

2021/0119637 A1\* 4/2021 Lin ..................... H03M 1/1245
2021/0359698 A1\* 11/2021 Sun ...................... H03M 1/468

\* cited by examiner

ANALOG TO DIGITAL CONVERSION APPARATUS AND METHOD HAVING QUICK CONVERSION MECHANISM

BACKGROUND OF THE INVENTION

1. Field of the Invention

The present invention relates to an analog to digital conversion apparatus and an analog to digital conversion method having quick conversion mechanism.

2. Description of Related Art

Wireless communication technology greatly improves modern life of human 4G communication technology provides extremely high data transmission speed such that the conversation can be performed with higher quality even performed by using video calling. In these applications, analog to digital conversion apparatuses are necessary. Electronic apparatuses nowadays are required to perform signal conversion from an analog form to a digital form.

In order to satisfy different requirements, different types of the analog to digital conversion apparatuses are designed. However, in order to meet the requirements of both high conversion speed and high signal-to-noise ratio, the design of the analog to digital conversion apparatuses faces lots of challenge.

SUMMARY OF THE INVENTION

In consideration of the problem of the prior art, an object of the present invention is to supply an analog to digital conversion apparatus and an analog to digital conversion method having quick conversion mechanis.

The present invention discloses an analog to digital conversion (ADC) apparatus having quick conversion mechanism that includes a plurality of ADC circuits performing cyclic sampling according to sequential timing and a noise-shaping circuit. The ADC circuits are configured to receive a previous higher-bit conversion result of a previous conversion result to perform prediction on a higher-bit section to generate a current higher-bit conversion result, wherein the previous conversion result is generated by a former ADC circuit of the ADC circuits that finishes performing conversion, perform conversion on an input analog signal according to different phases of a sampling clock based on a successive-approximation mechanism to generate a current lower-bit conversion result, wherein the sampling clock that has a frequency at least twice of the frequency of the input analog signal, and combine the current higher-bit conversion result and current lower-bit conversion result to generate a current conversion result and output a remained signal amount as a residue. The noise-shaping circuit is configured to, corresponding to each of the ADC circuits, perform calculation based on the residue from the former ADC circuit of the ADC circuits that finishes performing conversion to generate a noise-shaping reference signal. Each of the ADC circuits combines the current conversion result and the noise-shaping reference signal to generate an output digital signal.

The present invention also discloses an analog to digital conversion method having quick conversion mechanism used in an ADC apparatus that includes the steps outlined below. A previous higher-bit conversion result of a previous conversion result is respectively received by a plurality of ADC circuits performing cyclic sampling according to sequential timing, to perform prediction on a higher-bit section to generate a current higher-bit conversion result, wherein the previous conversion result is generated by a former ADC circuit of the ADC circuits that finishes performing conversion. Conversion on an input analog signal is respectively performed by the ADC circuits according to different phases of a sampling clock based on a successive-approximation mechanism to generate a current lower-bit conversion result, wherein the sampling clock that has a frequency at least twice of the frequency of the input analog signal. The current higher-bit conversion result and the current lower-bit conversion result are respectively combined the ADC circuits to generate a current conversion result and output a remained signal amount as a residue. Corresponding to each of the ADC circuits, calculation is performed based on the residue from the former ADC circuit of the ADC circuits that finishes performing conversion by a noise-shaping circuit to generate a noise-shaping reference signal. The current conversion result and the noise-shaping reference signal are combined by each of the ADC circuits to generate an output digital signal.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide an analog to digital conversion apparatus and an analog to digital conversion method having quick conversion mechanism to make the former ADC circuit that finishes performing conversion transmit higher-bit conversion result and residue such that the latter ADC circuit performs prediction to generate higher-bit conversion result and further perform noise-shaping accordingly to obtain an analog to digital conversion that has quick speed and high signal-to-noise ratio.

Figure 1:
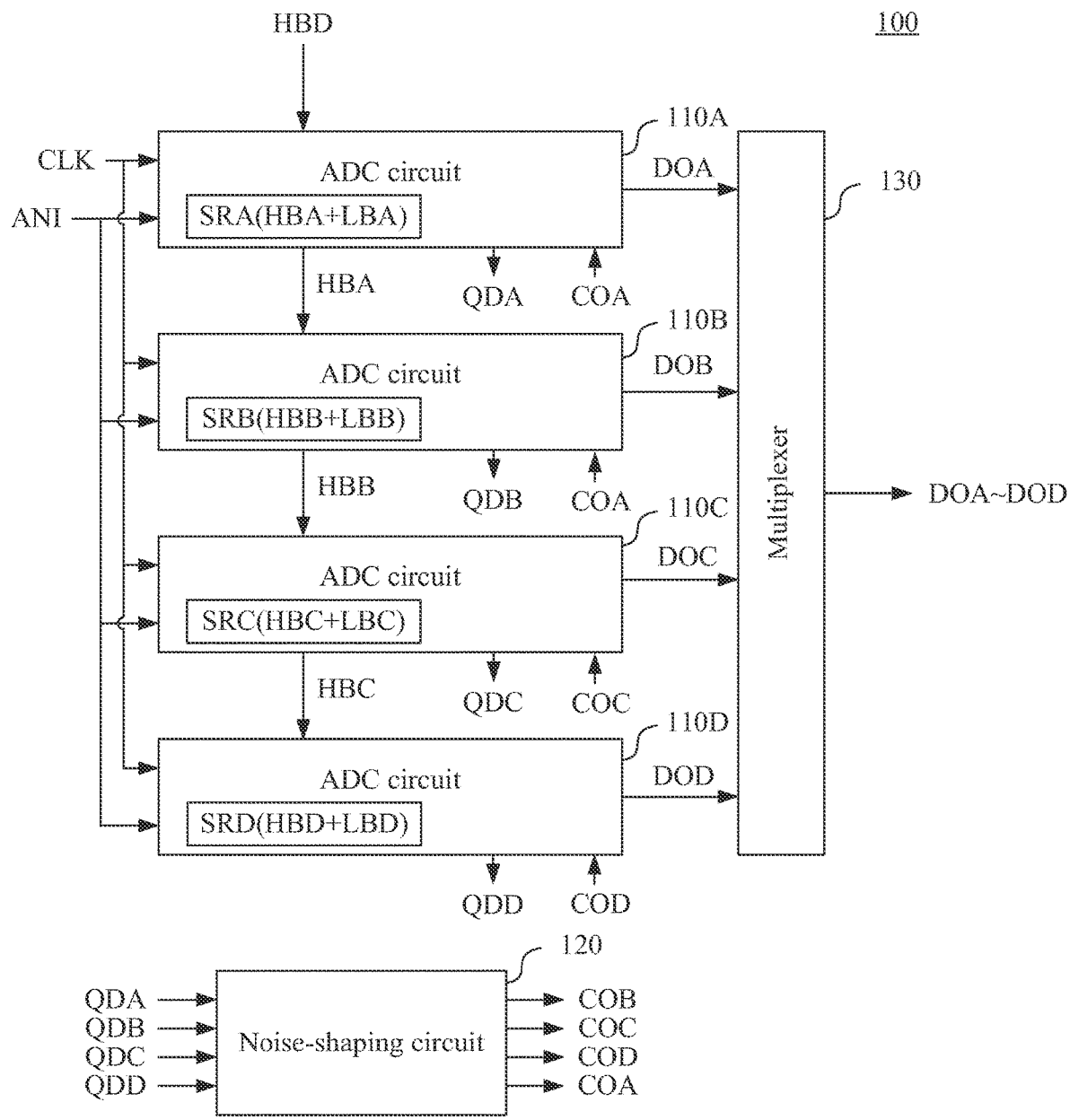
FIG. 1 illustrates a block diagram of an ADC apparatus having quick conversion mechanism according to an embodiment of the present invention.

Reference is now made to FIG. 1. FIG. 1 illustrates a block diagram of an ADC apparatus 100 having quick conversion mechanism according to an embodiment of the present invention. The ADC apparatus 100 includes a plurality of ADC circuits 110A~410D, a noise-shaping circuit 120 and a multiplexer 130.

Based on a time-interleaved mechanism, each of ADC circuits 110A~410D performs cyclic sampling on an input analog signal ANI according to sequential timing established by different phases of a sampling clock CLK. For example, when the frequency of the sampling clock CLK is 1 GHz, each of the ADC circuits 110A~410D operates at a frequency of 250 MHz and performs sampling respectively corresponding to the phase of 0, 90, 180 and 270 degrees, and generates a final conversion result with the frequency of 1 GHz.

In an embodiment, a frequency of the sampling clock CLK is at least twice of the frequency of the input analog signal ANI. Under such a condition, the over-sampling rate of the sampling clock CLK relative to the input analog signal ANI is at least 1. In other embodiments, the frequency of the sampling clock CLK can be four times (the corresponding over-sampling rate is 2) or even higher multiple of the frequency of the input analog signal ANI.

The ADC circuits 110A~410D respectively generates conversion results SRA~SRD. The conversion results SRA~SRD includes higher-bit conversion results HBA~HBD and lower-bit conversion results LBA~LBD. Since the conversion results SRA~SRD are generated inside of the ADC circuits 110A~410D, the conversion results SRA~SRD are illustrated as rectangles in the ADC circuits 110A~410D in FIG. 1.

Since the frequency of the sampling clock CLK is higher than the frequency of the input analog signal ANI, the ADC circuits 110A~410D can receive a previous higher-bit conversion result of a previous conversion result during sampling and perform prediction accordingly to generate a current higher-bit conversion result. The previous conversion result is generated by a former ADC circuit of the ADC circuits 110A~410D that finishes performing conversion.

Subsequently, the ADC circuits 110A~410D respectively perform conversion on the input analog signal ANI according to different phases of the sampling clock CLK based on a successive-approximation mechanism to generate current lower-bit conversion results LBA~LBD.

Further, the ADC circuits 110A~410D respectively combine the current higher-bit conversion results HBA~HBD and the current lower-bit conversion results LBA~LBD to generate the current conversion results SRA~SRD and output remained signal amounts as residues QDA~QDD.

The operation of the ADC circuits is described in detail by using the ADC circuit 110B as an example in the following paragraphs.

In an embodiment, the number of the former ADC circuit is one and such a former ADC circuit is the previous one neighboring to the current one. As a result, the ADC circuit 110A serves as the former ADC circuit of the ADC circuit 110B. The conversion result SRA is the current conversion result for the ADC circuit 110A and is the previous conversion result for the ADC circuit 110B. The higher-bit conversion result HBA of the conversion result SRA therefore serves as the previous higher-bit conversion result for the ADC circuit 110B.

The ADC circuit 110B receives the higher-bit conversion result HBA of the conversion result SRA to generate the current higher-bit conversion result SRB accordingly. In an embodiment, the ADC circuit 110B can perform prediction based on a predetermined operation method to generate the higher-bit conversion result SRB. Further, the ADC circuit 110B may receive the higher-bit conversion result HBA when the ADC circuit 110A finishes generating the higher-bit conversion result HBA and before the ADC circuit 110A generates the lower-bit conversion result LBA, to generate the higher-bit conversion result HBB thereof.

It is appreciated that in an embodiment, the number of the former ADC circuit can be more than one. Take the ADC circuit 110A as an example, when there are two former ADC circuits, the ADC circuit 110A can perform prediction with the use of such as extrapolation or other operation methods according to the higher-bit sections HBC and HBD of the conversion results SRC and SRD to generate the higher-bit conversion result HBA. The other ADC circuits 110B~410D can perform identical operations. Therefore, no more detail is described herein.

Subsequently, the ADC circuit 110B performs conversion on the input analog signal ANI according to the phase of the sampling clock CLK based on the successive-approximation mechanism to generate the lower-bit conversion result LBB.

Moreover, the ADC circuit 110B combines the current higher-bit conversion result HBB and current lower-bit conversion result LBB to generate the current conversion result SRB and output a remained signal amount as a residue QDB.

An implementation of the ADC circuit 110B is described in the following paragraphs.

Figure 2:
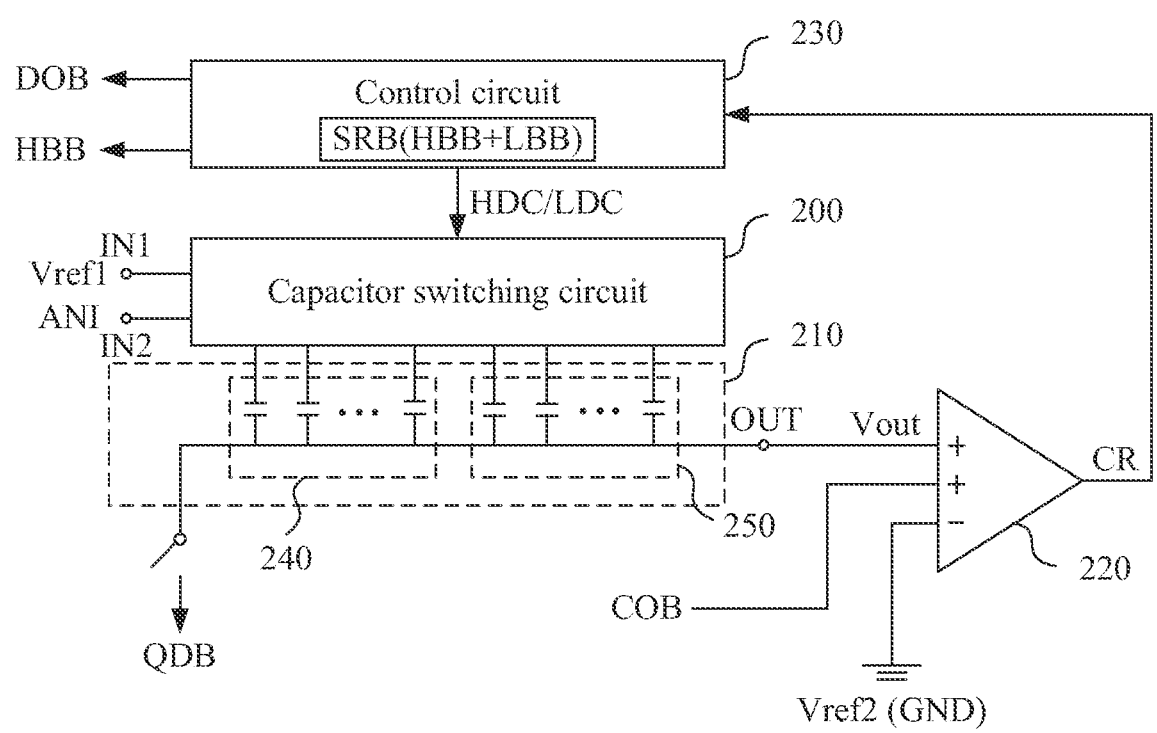
FIG. 2 illustrates a block diagram of the ADC circuit according to an embodiment of the present invention.

Reference is now made to FIG. 2. FIG. 2 illustrates a block diagram of the ADC circuit 110B according to an embodiment of the present invention. The ADC circuit 110B includes a capacitor switching circuit 200, a DAC capacitor array 210, a comparing circuit 220 and a control circuit 230.

The DAC capacitor array 210 includes a plurality of higher-bit capacitors 240 and a plurality of lower-bit capacitors 250, configured to receive a first reference voltage Vref1 from a first input terminal IN1 through the capacitor switching circuit 200 and receive the input analog signal ANI from a second input terminal IN2, to generate an output voltage Vout at an output terminal OUT.

In practical implementation, the capacitor switching circuit 200 may include a plurality of switching elements (not illustrated in the figure) such that different connection configurations can be generated between the higher-bit capacitors 240, the lower-bit capacitors 250, the first input terminal IN1 and the second input terminal IN2. From the highest bit to the lowest bit, each of the higher-bit capacitors 240 and the lower-bit capacitors 250 has a voltage adjustment amount from the largest value to a lowest value such that the output voltage Vout is generated at the output terminal OUT according to different connection configurations.

It is appreciated that the illustrations of capacitor switching circuit 200 and the DAC capacitor array 210 are simplified in FIG. 2. The detail circuit configuration can be different depending on practical requirements. The present invention is not limited to any specific configuration.

The comparing circuit 220 is configured to compare the output voltage Vout and the second reference voltage Vref2 to generate a comparison result CR. In an embodiment, the second reference voltage Vref2 is the ground voltage GND.

The control circuit 230 controls the capacitor switching circuit 200 with a group of higher-bit digital codes HDC and a group of lower-bit digital codes LDC, so as to control the capacitor switching circuit 200 to generate a higher-bit connection combination corresponding to the higher-bit capacitors 240 according to the previous higher-bit conversion result (e.g., the higher-bit conversion result HBA).

Further, the control circuit 230 further controls the capacitor switching circuit 200 to generate a lower-bit connection combination corresponding to the lower-bit capacitors 250 according to the comparison result CR based on the successive-approximation mechanism. In an embodiment, the term "successive-approximation mechanism" means that the control circuit 230 keeps modifying the connection configuration of the lower-bit capacitors 250 by controlling the capacitor switching circuit 200 such that the output voltage Vout generated by the DAC capacitor array 210 approximates the second reference voltage Vref2.

When the output voltage Vout approximates the second reference voltage Vref2, the higher-bit digital codes HDC and the lower-bit digital codes LDC that the higher-bit connection combination and the lower-bit connection combination respectively correspond to approximate the input analog signal ANI. Under such a condition, the higher-bit digital codes HDC that the higher-bit connection combination corresponds to serves as the higher-bit conversion result HBB, and the lower-bit digital codes LDC that the lower-bit connection combination corresponds to serves as the lower-bit conversion result LBB. The combination of the higher-bit digital codes HDC and the lower-bit digital codes LDC is the conversion result SRB.

In an embodiment, since the output voltage Vout approximates the second reference voltage Vref2 instead of equaling the reference voltage Vref2, the ADC circuit 110B outputs the remained signal amount of the output voltage Vout as the residue QDB after the conversion result SRB is generated.

The ADC circuits 110A, 110C and 110D may have the same configuration and operation as those of the ADC circuit 110B.

As a result, the ADC circuit 110B serves as the former ADC circuit of the ADC circuit 110C. The ADC circuit 110C receives the higher-bit conversion result HBB, performs prediction accordingly to generate the higher-bit conversion result HBC, performs conversion on the input analog signal ANI according to the corresponding phase of the sampling clock CLK to generate the lower-bit conversion result LBC, combines the higher-bit conversion result HBC and the lower-bit conversion result LBC to generate the conversion result SRC and outputs the remained signal amount as the residue QDC.

Similarly, the ADC circuit 110C serves as the former ADC circuit of the ADC circuit 110D. The ADC circuit 110D receives the higher-bit conversion result HBC, performs prediction accordingly to generate the higher-bit conversion result HBD, performs conversion on the input analog signal ANI according to the corresponding phase of the sampling clock CLK to generate the lower-bit conversion result LBD, combines the higher-bit conversion result HBD and the lower-bit conversion result LBD to generate the conversion result SRD and outputs the remained signal amount as the residue QDD.

Finally, since the ADC circuits 110A~410D perform cyclic sampling, the ADC circuit 110D serves as the former ADC circuit of the ADC circuit 110A. The ADC circuit 110A receives the higher-bit conversion result HBD, performs prediction accordingly to generate the higher-bit conversion result HBA, performs conversion on the input analog signal ANI according to the corresponding phase of the sampling clock CLK to generate the lower-bit conversion result LBA, combines the higher-bit conversion result HBA and the lower-bit conversion result LBA to generate the conversion result SRA and outputs the remained signal amount as the residue QDA.

In the present embodiment, the noise-shaping circuit 120 is independently disposed outside of the ADC circuits 110A~410D as a single circuit, and is configured to receive the residues QDA~QDD from the ADC circuits 110A~410D to perform operation and generate noise-shaping reference signals COA~COD.

Further, the ADC circuits 110A~410D respectively combine the current conversion results SRA~SRD and the noise-shaping reference signals COA~COD to generate the output digital signals DOA~DOD.

The detail description is performed by taking the ADC circuit 110B as an example in the following paragraphs.

Take the condition that the number of the former ADC circuit is one and is the previous one neighboring to the current one as an example, the noise-shaping circuit 120 in FIG. 1 receives the residue QDA from the ADC circuit 110A to generate the noise-shaping reference signal COB corresponding to the ADC circuit 110B, such that the ADC circuit 110B combines the conversion result SRB and the noise-shaping reference signal COB to generate the output digital signal DOB. The noise-shaping circuit 120 can generate the noise-shaping reference signal COB according to the residue QDA by using any predetermined operation method. The present invention is not limited to any specific generation method.

In an embodiment, the noise-shaping reference signal COB can be fed to the comparing circuit 220 such that the comparing circuit 220 compares a sum of the noise-shaping reference signal COB and the output voltage Vout and the second reference voltage Vref2 to generate the comparison result CR.

The control circuit 230 controls the capacitor switching circuit 200 according to the comparison result CR based on the successive-approximation mechanism to update the higher-bit connection combination and the lower-bit connection combination, such that the sum approximates the second reference voltage Vref2 to generate the output digital signal DOB according to the updated higher-bit connection combination and the updated lower-bit connection combination. More specifically, the higher-bit digital code HDC that the updated higher-bit connection combination corresponds to and the lower-bit digital codes LDC that the updated lower-bit connection combination corresponds to are combined to generate the output digital signal DOB.

It is appreciated that the method that feeds the noise-shaping reference signal COB to the comparing circuit 220 is merely an example. In another embodiment, the DAC capacitor array 210 may further include a plurality of noise-shaping capacitors (not illustrated) to feed the analog voltage of the noise-shaping reference signal COB to these noise-shaping capacitors to accomplish the object of summing the noise-shaping reference signal COB and the output voltage Vout. The comparing circuit 220 further performs comparison accordingly and the control circuit 230 further updates the higher-bit connection combination and the lower-bit connection combination to generate the output digital signal DOB according to the updated higher-bit connection combination and the updated lower-bit connection combination.

By using the noise-shaping circuit 120 to generate the noise-shaping reference signal COB, the ADC circuit 110B can reduce the noise of the conversion result SRB generated due to digital quantization so as to increase the signal to noise ratio (SNR).

Similarly, the noise-shaping circuit 120 receives the residue QDB from the ADC circuit 110B to generate the noise-shaping reference signal COC corresponding to the ADC circuit 110C, such that the ADC circuit 110C combines the conversion result SRC and the noise-shaping reference signal COC to generate the output digital signal DOC.

The noise-shaping circuit 120 receives the residue QDC from the ADC circuit 110C to generate the noise-shaping reference signal COD corresponding to the ADC circuit 110D, such that the ADC circuit 110D combines the conversion result SRD and the noise-shaping reference signal COD to generate the output digital signal DOD.

The noise-shaping circuit 120 receives the residue QDD from the ADC circuit 110D to generate the noise-shaping reference signal COA corresponding to the ADC circuit 110A, such that the ADC circuit 110A combines the conversion result SRA and the noise-shaping reference signal COA to generate the output digital signal DOA.

It is appreciated that in order to keep the figures from being complex, the noise-shaping circuit 120 in FIG. 1 is not illustrated to be directly coupled to the ADC circuits 110A~110D. However, in practical implementation, the noise-shaping circuit 120 is directly coupled to the ADC circuits 110A~410D to perform signal receiving and transmitting described above.

The multiplexer 130 sequentially outputs the output digital signals DOA~DOD of the ADC circuits 110A~410D.

Figure 3:
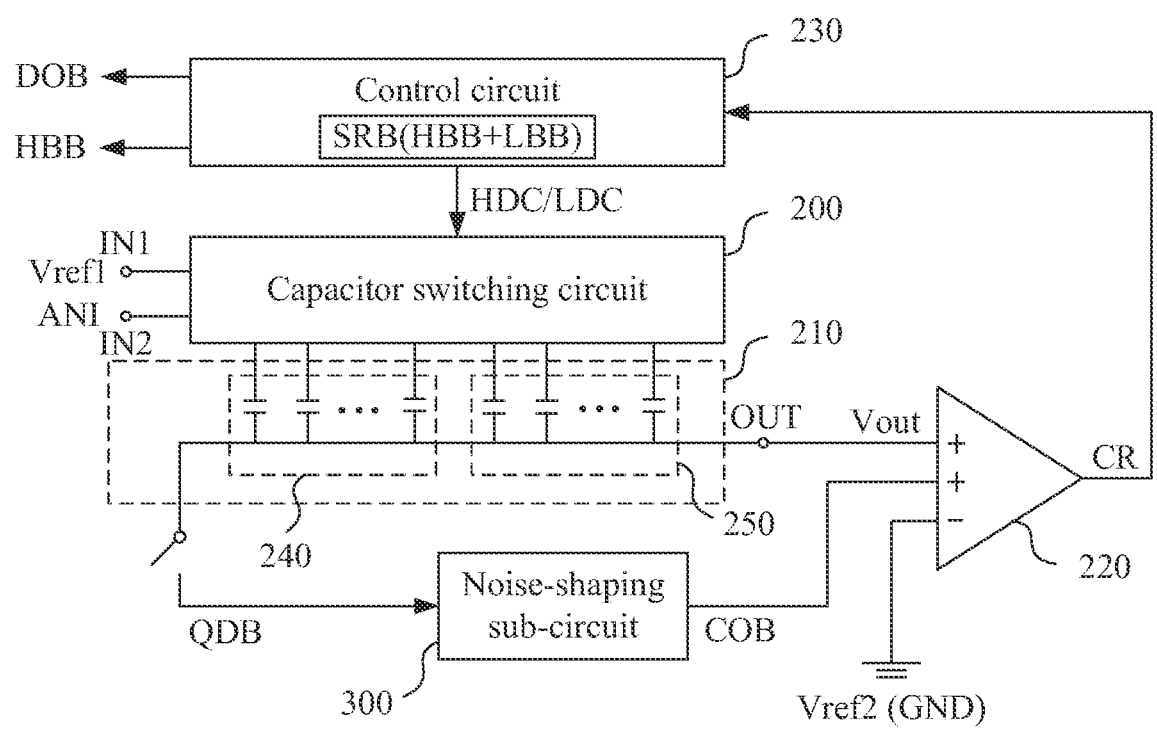
FIG. 3 illustrates another block diagram of the ADC circuit according to another embodiment of the present invention.

Reference is now made to FIG. 3. FIG. 3 illustrates another block diagram of the ADC circuit 110B according to another embodiment of the present invention.

The ADC circuit 110B in FIG. 3 is similar to the ADC circuit 110B in FIG. 2. As a result, the identical components and configurations are not described herein. In the present embodiment, the noise-shaping circuit 120 may include a plurality of noise-shaping sub-circuits 300 each disposed in one of the ADC circuits 110A~410D to respectively receive one of the residues QDA~QDD and generate one of the noise-shaping reference signals COA~COD.

As a result, the ADC apparatus of the present invention can make the former ADC circuit that finishes performing conversion transmit higher-bit conversion result and residue such that the latter ADC circuit performs prediction to generate higher-bit conversion result and further perform noise-shaping accordingly to obtain an analog to digital conversion that has quick speed and high signal-to-noise ratio.

It is appreciated that the ADC apparatus that includes four ADC circuits is used as an example in the embodiments described above. In other embodiments, the number of the ADC circuits included in the ADC apparatus can be different according to practical requirements. The present invention is not limited to a specific number.

Figure 4:
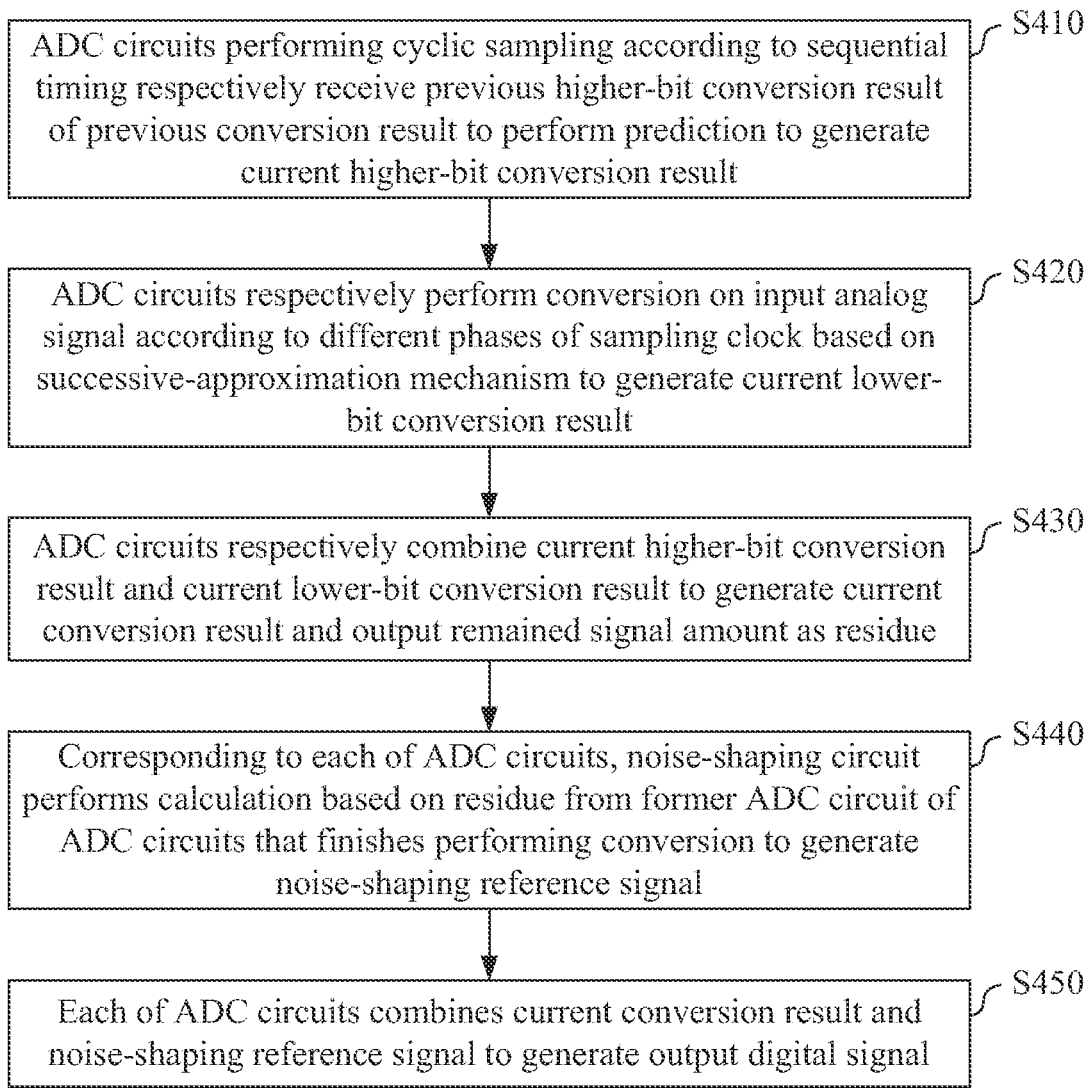
FIG. 4 illustrates a flow chart of an analog to digital conversion method according to an embodiment of the present invention.

Reference is now made to FIG. 4. FIG. 4 illustrates a flow chart of an analog to digital conversion method 400 according to an embodiment of the present invention.

In addition to the apparatus described above, the present disclosure further provides the analog to digital conversion method 400 that can be used in such as, but not limited to, the ADC apparatus 100 in FIG. 1. As illustrated in FIG. 4, an embodiment of the analog to digital conversion method 400 includes the following steps.

In step S410, a previous higher-bit conversion result of a previous conversion result is respectively received by the ADC circuits 110A~110D performing cyclic sampling according to sequential timing, to perform prediction on a higher-bit section to generate the current higher-bit conversion result (one of the higher-bit conversion results HBA~HBD), wherein the previous conversion result is generated by a former ADC circuit of the ADC circuits 110A~410D that finishes performing conversion.

In step S420, conversion on the input analog signal ANI is respectively performed by the ADC circuits 110A~410D according to different phases of the sampling clock CLK based on the successive-approximation mechanism to generate the current lower-bit conversion result (i.e., the current lower-bit conversion results LBA~LBD), wherein the sampling clock CLK that has the frequency at least twice of the frequency of the input analog signal ANI.

In step S430, the current higher-bit conversion result (i.e., the current higher-bit conversion results HBA~HBD) and the current lower-bit conversion result (i.e., the current lower-bit conversion results LBA~LBD) are respectively combined the ADC circuits 110A~110D to generate the current conversion result (i.e., the current conversion results SRA~SRD) and output the remained signal amount as the residue (i.e., the residues QDA~QDD).

In step S440, corresponding to each of the ADC circuits 110A~410D, calculation is performed based on the residue (i.e., the residues QDA~QDD) from the former ADC circuit of the ADC circuits 110A~410D that finishes performing conversion by the noise-shaping circuit 120 to generate the noise-shaping reference signal (i.e., the noise-shaping reference signals COA~COD).

In step S450, the current conversion result (i.e., the current conversion results SRA~SRD) and the noise-shaping reference signal (i.e., the noise-shaping reference signals COA~COD) are combined by each of the ADC circuits 110A~410D to generate the output digital signal (i.e., the output digital signals DOA~DOD).

It is appreciated that the embodiments described above are merely an example. In other embodiments, it should be appreciated that many modifications and changes may be made by those of ordinary skill in the art without departing from the spirit of the disclosure.

In summary, the analog to digital conversion apparatus and the analog to digital conversion method having quick conversion mechanism can make the former ADC circuit that finishes performing conversion transmit higher-bit conversion result and residue such that the latter ADC circuit performs prediction to generate higher-bit conversion result and further perform noise-shaping accordingly to obtain an analog to digital conversion that has quick speed and high signal-to-noise ratio.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An analog to digital conversion (ADC) apparatus having quick conversion mechanism, comprising:
   a plurality of ADC circuits performing cyclic sampling according to sequential timing, configured to:
      receive a previous higher-bit conversion result of a previous conversion result to perform prediction on a higher-bit section to generate a current higher-bit conversion result, wherein the previous conversion result is generated by a former ADC circuit of the ADC circuits that finishes performing conversion;
      perform conversion on an input analog signal according to different phases of a sampling clock based on a successive-approximation mechanism to generate a current lower-bit conversion result, wherein the sampling clock has a frequency at least twice of the frequency of the input analog signal; and
      combine the current higher-bit conversion result and current lower-bit conversion result to generate a current conversion result and output a remained signal amount as a residue; and
   a noise-shaping circuit configured to, corresponding to each of the ADC circuits, perform calculation based on the residue from the former ADC circuit of the ADC circuits that finishes performing conversion to generate a noise-shaping reference signal,
   wherein each of the ADC circuits combines the current conversion result and the noise-shaping reference signal to generate an output digital signal.

2. The ADC apparatus of claim 1, wherein each of the ADC circuits comprises:
   a capacitor switching circuit;
   a digital-to-analog conversion (DAC) capacitor array comprising a plurality of higher-bit capacitors and a plurality of lower-bit capacitors, configured to receive a first reference voltage from a first input terminal through the capacitor switching circuit and receive the input analog signal from a second input terminal, to generate an output voltage at an output terminal;
   a comparing circuit configured to compare the output voltage and a second reference voltage to generate a comparison result; and
   a control circuit configured to control the capacitor switching circuit with a group of higher-bit digital codes and a group of lower-bit digital codes, so as to control the capacitor switching circuit to generate a higher-bit connection combination corresponding to the higher-bit capacitors according to the previous higher-bit conversion result and further control the capacitor switching circuit to generate a lower-bit connection combination corresponding to the lower-bit capacitors according to the comparison result based on the successive-approximation mechanism,
   wherein when the output voltage approximates the second reference voltage, the group of higher-bit digital codes and the group of lower-bit digital codes that the higher-bit connection combination and the lower-bit connection combination respectively correspond to approximate the input analog signal, such that the group of higher-bit digital codes serve as the current higher-bit conversion result, the group of lower-bit digital codes serve as the current lower-bit conversion result and the remained signal amount of the output voltage serves as the residue.

3. The ADC apparatus of claim 2, wherein the comparing circuit is further configured to compare a sum of the noise-shaping reference signal and the output voltage and the second reference voltage to generate the comparison result;
   the control circuit controls the capacitor switching circuit according to the comparison result based on the successive-approximation mechanism to update the higher-bit connection combination and the lower-bit connection combination, such that the sum approximates the second reference voltage to generate the output digital signal according to the updated higher-bit connection combination and the updated lower-bit connection combination.

4. The ADC apparatus of claim 1, wherein the number of the former ADC circuit is one or more than one, and when the number of the former ADC circuit is more than one, each of the ADC circuits performs prediction according to a multiple of the previous higher-bit conversion results of a multiple of the previous conversion results to generate the current higher-bit conversion result.

5. The ADC apparatus of claim 1, wherein the noise-shaping circuit is independently disposed outside of the ADC circuits as a single circuit, or comprises a plurality of noise-shaping sub-circuits each disposed in one of the ADC circuits.

6. The ADC apparatus of claim 1, further comprising a multiplexer configured to sequentially output the output digital signal of each of the ADC circuits.

7. An analog to digital conversion method having quick conversion mechanism used in an ADC apparatus, the analog to digital conversion method comprising:
   receiving a previous higher-bit conversion result of a previous conversion result respectively by a plurality of ADC circuits performing cyclic sampling according to sequential timing, to perform prediction on a higher-bit section to generate a current higher-bit conversion result, wherein the previous conversion result is generated by a former ADC circuit of the ADC circuits that finishes performing conversion;
   performing conversion on an input analog signal respectively by the ADC circuits according to different phases of a sampling clock based on a successive-approximation mechanism to generate a current lower-bit conversion result, wherein the sampling clock has a frequency at least twice of the frequency of the input analog signal;
   combining the current higher-bit conversion result and current lower-bit conversion result respectively by the ADC circuits to generate a current conversion result and output a remained signal amount as a residue;
   corresponding to each of the ADC circuits, performing calculation based on the residue from the former ADC circuit of the ADC circuits that finishes performing conversion by a noise-shaping circuit to generate a noise-shaping reference signal; and
   combining the current conversion result and the noise-shaping reference signal by each of the ADC circuits to generate an output digital signal.

8. The analog to digital conversion method of claim 7, further comprising:
   receiving a first reference voltage from a first input terminal through the capacitor switching circuit and receiving the input analog signal from a second input terminal, to generate an output voltage at an output terminal by a DAC capacitor array comprising a plurality of higher-bit capacitors and a plurality of lower-bit capacitors;
   comparing the output voltage and a second reference voltage by a comparing circuit to generate a comparison result; and
   controlling the capacitor switching circuit with a group of higher-bit digital codes and a group of lower-bit digital codes by a control circuit, to control the capacitor switching circuit to generate a higher-bit connection combination corresponding to the higher-bit capacitors according to the previous higher-bit conversion result and further control the capacitor switching circuit to generate a lower-bit connection combination corresponding to the lower-bit capacitors according to the comparison result based on the successive-approximation mechanism,
   wherein when the output voltage approximates the second reference voltage, the group of higher-bit digital codes and the group of lower-bit digital codes that the higher-bit connection combination and the lower-bit connection combination respectively correspond to approximate the input analog signal, such that the group of higher-bit digital codes serve as the current higher-bit conversion result, the group of lower-bit digital codes serve as the current lower-bit conversion result and the remained signal amount of the output voltage serves as the residue.

9. The analog to digital conversion method of claim 8, further comprising:
   comparing a sum of the noise-shaping reference signal and the output voltage and the second reference voltage by the comparing circuit to generate the comparison result; and controlling the capacitor switching circuit according to the comparison result based on the successive-approximation mechanism by the control circuit to update the higher-bit connection combination and the lower-bit connection combination, such that the sum approximates the second reference voltage to generate the output digital signal according to the updated higher-bit connection combination and the updated lower-bit connection combination.

10. The analog to digital conversion method of claim 7, wherein the number of the former ADC circuit is one or more than one, and when the number of the former ADC circuit is more than one, the analog to digital conversion method further comprises:

performing prediction by each of the ADC circuits according to a multiple of the previous higher-bit conversion results of a multiple of the previous conversion results to generate the current higher-bit conversion result.

11. The analog to digital conversion method of claim 7, wherein the noise-shaping circuit is independently disposed outside of the ADC circuits as a single circuit, or comprises a plurality of noise-shaping sub-circuits each disposed in one of the ADC circuits.

12. The analog to digital conversion method of claim 7, further comprising:

sequentially outputting the output digital signal of each of the ADC circuits by a multiplexer.

\* \* \* \* \*